(12) United States Patent
Horiuchi et al.

(10) Patent No.: US 6,229,099 B1
(45) Date of Patent: May 8, 2001

(54) MULTI-LAYER CIRCUIT BOARD WITH PARTICULAR PAD SPACING

(75) Inventors: Michio Horiuchi; Eiji Yoda, both of Nagano; Chiaki Takubo, Tokyo, all of (JP)

(73) Assignees: Shinko Electric Industries Co., Ltd., Nagano; Kabushiki Kaisha Toshiba, Kanagawa, both of (JP)

( * ) Notice: Subject to any disclaimer, the term of this patent is extended or adjusted under 35 U.S.C. 154(b) by 0 days.

(21) Appl. No.: 09/092,845

(22) Filed: Jun. 5, 1998

(30) Foreign Application Priority Data

Jun. 5, 1997  (JP) .................................................. 9-146993

(51) Int. Cl.$^7$ ...................................................... H01R 9/09
(52) U.S. Cl. ......................... 174/261; 174/260; 257/778; 361/768; 361/780; 361/777; 361/783
(58) Field of Search .................................... 174/261, 255, 174/260; 361/767, 768, 777, 780, 753; 257/778

(56) References Cited

U.S. PATENT DOCUMENTS

| 5,467,252 | 11/1995 | Nomi et al. | 361/760 |
| 5,682,297 | * 10/1997 | Silva | 361/777 |

FOREIGN PATENT DOCUMENTS 0 308 714   3/1989  (EP) .

OTHER PUBLICATIONS

Patent Abstracts of Japan, vol. 007, No. 186 (E–193), Aug. 16, 1983 & JP 58 090747 (Nippon Denki KK), May 30, 1983.

Darnauer, J. et al., "Field Programmable Multi–Chip Module (FPMCM)—An Integration of FPGA and MCM Technology", Jan. 31, 1995, pp. 50–55 (IEEE 1994).

Dehkordi, P. et al., "Determination of Area–Array Bond Pitch For Optimum MCM Systems: A Case Study", Feb. 4, 1997, pp. 8–12 (IEEE 1997).

* cited by examiner

Primary Examiner—Jeffrey Gaffin
Assistant Examiner—Kamand Cuneo
(74) Attorney, Agent, or Firm—Pennie & Edmonds LLP

(57) ABSTRACT

The invention is concerned with a multi-layer circuit board for mounting an electronic part such as a semiconductor chip having as many pins as 40×40 pins arranged as an array on the side of the mounting surface or a semiconductor device having lands arranged as an array on the side of the mounting surface. The invention provides a multi-layer circuit board with particular pad spacing and configuration which make it possible to mount an electronic part such as a semiconductor chip or a semiconductor device while reducing the number of circuit board layers that are laminated one upon the other.

6 Claims, 16 Drawing Sheets

MULTI-LAYER CIRCUIT BOARD WITH PARTICULAR PAD SPACING

BACKGROUND OF THE INVENTION

1. Field of the Invention

The present invention relates to a multi-layer circuit board for mounting an electronic part such as a semiconductor chip or a semiconductor device having a number of electrodes, pads, or lands, hereinafter referred to as lands, arranged in a lattice form or in a staggered form.

2. Description of the Related Art

In modem semiconductor devices, the logic devices are becoming highly functional and highly integrated, feature more inputs and outputs, and are being mounted ever more densely. Therefore, products have been produced to compensate for a lack of space for forming lands, and to cope with increased numbers of inputs and outputs, by arranging lands like an array on the land-forming surface of a semiconductor chip. FIG. 25 illustrates a prior art or mounting a semiconductor chip 4 on a substrate 5 relying on a flip chip connection. The semiconductor chip 4 shown here has lands 6 arranged on the outer peripheral edges thereof. Circuit patterns 7 are connected to the, lands 6 and are drawn outwardly. In this case the respective circuit patterns 7 are connected to the respective electrodes 6 on a single, common surface.

FIG. 24 illustrates the arrangement of lands on a wiring member for mounting a semiconductor chip having two rows of lands 6 arranged along the outer peripheral edges of the land-forming surface, and the arrangement of circuit patterns 7 connected to the lands 8. In this example, the pattern 7 is drawn from an intermediate portion of the space between the adjacent two lands 8; i.e., the respective circuit pattern 7 is drawn from the respective land 8 on a single common surface. In drawing the circuit patterns 7 from the lands 8 arranged in plural rows, it is general practice to connect a pattern on the land 8 of the inner side and to draw the pattern outwardly through the intermediate portion between the two adjacent lands 8 of the outer side.

When a number of lands are arranged like an array on the land-forming surface to increase the numbers of inputs and outputs, however, it becomes no longer possible to draw the wirings toward the outer side from all lands on the surface though it may vary depending upon the distance between the lands and the number of the lands.

To solve this problem, it has been contrived to form circuit boards in many layers for mounting a semiconductor chip, and to suitably arrange the circuit patterns on the laminated circuit boards, in order to electrically connect the lands to every land of the semiconductor chip and to make the circuit patterns. FIG. 26 illustrates an example where a semiconductor chip 4 is mounted on a multi-layer circuit board obtained by laminating a plurality of layers. Thus, according to the method of laminating the plurality of layers, it becomes possible to electrically connect the semiconductor chip 4 having a number of lands 6 arranged like an array to the external connection terminals without causing the circuit patterns to interfere. In FIG. 26, reference numeral 7a denotes a circuit pattern of an inner layer, and 5a to 5d denote circuit boards which are the first to fourth layers.

When the semiconductor chip having lands arranged like an array is to be mounted on the circuit board, about two circuit boards may be laminated one upon the other provided the number of the lands is not very large. When the semiconductor chip has as many pins as, for example, 30×30 pins or 40×40 pins, however, the circuit boards must be laminated in 6 to 10 layers.

When the circuit boards in which the circuit patterns are very densely formed are to be laminated in many layers, there will be employed a high-density wiring method such as build-up method accompanied, however, by serious problems in regard to yield of the products, reliability and the cost of production. That is, when the circuit patterns are to be formed in many layers, vias are formed in each layer to accomplish an electric connection between the circuit patterns and the circuit patterns across the layer, and the layers are successively laminated, requiring a high degree of precision without, however, offering high degree of reliability. When many layers are laminated, furthermore, it is required that none of the layers is defective, involving further increased technical difficulty.

To produce a multi-layer circuit board by laminating circuit patterns in many layers, while maintaining a good yield, a reduction in the number of wiring layers could be an effective solution.

SUMMARY OF THE INVENTION

The present invention is concerned with a multi-layer circuit board for mounting an electronic part such as a semiconductor chip having as many as 40×40 pins arranged in an array on the side of the mounting surface or a semiconductor device having lands arranged in an array on the side of the mounting surface. The object of the present invention is to provide a multi-layer circuit board which makes it possible to mount an electronic part such as a semiconductor chip or a semiconductor device, despite a decreased number of circuit boards being laminated one upon the other, which features improved yield of production and which can be used as a highly reliable product. In order to accomplish the above-mentioned object, the present invention provides the following multi-layer circuit board.

The present invention provides a multi-layer circuit board formed by e.g., laminating a plurality of layers in order to mount an electronic part such as a semiconductor chip or a semiconductor device having many lands arranged in the form of an array. Upon contriving the arrangement of circuit patterns on each circuit layer, a multi-layer circuit board can be constituted by forming the circuit boards (wiring layers) in a decreased number of layers. There is no particular limitation on the method of fabricating the multi-layer circuit board, and various methods, such as a build-up method, can be employed.

Arrangements of lands of the electronic parts can be divided into a normal lattice arrangement and a staggered lattice arrangement. Here, when the lands are arranged in the normal lattice form or staggered lattice form, a problem arises in regard to how the circuit patterns can be arranged to accomplish the highest efficiency.

The circuit patterns pass through among the lands. In the practical products, therefore, the circuit patterns must be set depending upon the predetermined conditions such as pitch of lands, diameter of lands, width of patterns and gap between the patterns.

According to the present invention, the following method is employed for determining the arrangement of circuit patterns on each circuit board in a multi-layer circuit board formed by laminating the circuit boards. Upon arranging the circuit patterns according to this method, it is possible to form a multi-layer circuit board in the least number of layers.

First, considered below is a case where the lands are formed in a normal lattice arrangement maintaining an equal distance in the vertical and lateral directions.

Let it now be presumed that intermediate lands of a number of (n−2) do not exist except for the lands at both ends in the arrangement of lands of a number of n maintaining an equal distance, and that the number of wirings that can be passed (arranged) among the lands between both ends except the lands at both ends is m, then, m is given by the following formula, $$m=\{(\text{land pitch})\times(n-1)-(\text{land diameter})-(\text{space between patterns})\}+(\text{pattern width}+\text{space between patterns})$$

where land pitch is a distance between the centers of the lands ("a" in FIG. 1), land diameter is a diameter of the land ("b" in FIG. 1), space between patterns is a minimum distance that must be maintained between the neighboring circuit patterns ("c" in FIG. 1), and the pattern width is "d" in FIG. 1.

If it is considered that only one circuit pattern is allowed to pass through between the neighboring lands that are arranged in a number of n maintaining an equal distance, then, the number k of circuit patterns that can be arranged among the lands between the two ends is given by, $$k=(n-1)+(n-2)=2n-3$$

This means that there are (n−1) channels that permit the passage of circuit patterns among the lands of a number of n, that there are intermediate lands of a number of (n−2) excluding the lands at both ends, and that a circuit pattern can be drawn from each of these lands.

Upon comparing m with (k+1), therefore, when m<(k+1), there is obtained no effect for increasing the circuit patterns even if the circuit patterns are so arranged as to remove all intermediate lands among the lands of a number of n. When m≦(k+1), there is obtained the effect for increasing the circuit patterns when the circuit patterns are so arranged as to remove the intermediate lands.

In order to constitute a multi-layer circuit board using circuit boards in as small a number as possible, therefore, a minimum integer that gives m≦(k+1) is selected as a parameter, and the circuit patterns are arranged according to the value n.

Then, a value m is found from the conditions of a given land pitch, land diameter and pattern width, and is compared with (k+1) to find a minimum value n (integer) that gives m≧(k+1). Then, the conditions are found that remove the land sequences of a number of (n−2) for the value n, and the circuit patterns are preferentially drawn from the land sequences of the number of (n−2) to accomplish an optimum arrangement.

FIG. 1 illustrates an example in which the circuit patterns are effectively increased with n=3 to accomplish an efficient arrangement. In FIG. 1, the distance L—L represents two land pitches. When the lands 10 exist between the distance L—L, three circuit patterns can be arranged, i.e., a circuit pattern drawn from an intermediate land and two circuit patterns passing through the two lands sandwiched by the lands on both sides and the intermediate land.

On the other hand, when a land is removed between the distance L—L, and a circuit pattern is passed through a portion where the land used to exist, there can be arranged four circuit patterns between the distance L—L as shown. That is, among the three lands, an intermediate land is removed, and a circuit pattern 7 is passed to increase the number of circuit patterns by one. From this, every other land is erased from the land sequences, i.e., the circuit pattern is preferentially drawn from the land of an intermediate sequence, in order to increase the number of circuit patterns that are drawn out and to accomplish an efficient arrangement.

In the object product, the land pitch, land diameter, pattern width and space between patterns have been determined in advance, and it is easy to find the values m and (k+1) based on these values with n as a parameter. Based upon the calculated results, it can be easily determined which arrangement of circuit patterns would be efficient.

As will be described later by way of Examples, the circuit patterns on each circuit layer are designed by commonly setting the positions of land sequences (that are to be removed) from where the circuit patterns are to be drawn on each of the layers, and for the land sequences from where the circuit patterns are drawn on the preceding layer, the circuit patterns are also drawn from the same land sequences even on the next layer.

The foregoing description has dealt with the case where only one circuit pattern could be passed through between the neighboring lands. However, the same idea holds true even when the circuit patterns of a number of α can be passed through between the neighboring lands maintaining an ordinary distance.

Even in this case, when the (n−2) intermediate lands do not exist in the arrangement of the (n) lands maintaining an equal distance, the number m of circuit patterns that can be passed between the lands at both ends is given by, $$m=\{(\text{land pitch})\times(n-1)-(\text{land diameter})-(\text{space between patterns})\}.+(\text{pattern width}+\text{space between patterns})$$

When the intermediate lands are not erased, the number of circuit patterns that can be arranged among the lands of the number of n between the two ends is given by, $$k=\alpha(n-1)+(n-2)$$

Therefore, the values m and (k+1) found with n as a parameter are compared with each other to determine a minimum value n (integer) that gives m≧(k+1), conditions are determined based on the number of n for selectively subtracting the circuit patterns from the land sequences of the number of (n−2), and the land sequences are erased depending upon the conditions, in order to efficiently design the circuit patterns. That is, the idea for arranging a single circuit pattern can be adapted even under the condition where a plurality of circuit patterns are arranged between the neighboring lands (in the channel portion), in order to efficiently design the circuit patterns.

When the (n−2) lands are to be selected from the consecutively arranged (n) lands, the lands to be selected are those lands that remain when the lands at both ends are removed from the lands of the number of n.

Which (n−2) lands should be selected from the land sequences arranged in plural sequences or, in other words, how the (n−2) lands be arranged, is determined depending upon the case where the consecutively arranged lands of the number of n are repetitively arranged in a manner that the last land is overlapped on the first land of the next lands of the number of n (in this case, the sequences of the number of (n−1) serve as a recurring unit), depending upon the case where the lands of the number of n are repetitively arranged in a manner that the last land is positioned neighboring the first land of the next lands of the number of n (in this case, the sequences of the number of n serve as a recurring unit), and depending upon the case where the lands of the number of n are repetitively arranged in a manner that one or more additional lands are interposed between the last land and the first land of the next lands of the number of n.

The method of arranging the circuit patterns adapted to the above-mentioned case of normal lattice arrangement can be adapted, too, to the case where the lands are arranged in the staggered lattice form. That is, the staggered lattice arrangement can be regarded to be a lattice arrangement when viewed from a diagonal direction. Therefore, this arrangement is regarded to be the lattice arrangement as viewed from the diagonal direction, and there can be adapted the same as the lattice arrangement. That is, when the lattice arrangement is regarded to be the one that is viewed from the diagonal direction, values m and (k+1) are found from the land pitch, land diameter, pattern width, and space between patterns using n as a parameter, and an effective value n is found therefrom, and the land sequences are determined depending upon the value n for preferentially drawing the circuit patterns based on the same idea as that of the case of the lattice arrangement. In the case of the normal lattice arrangement, the method of the present invention can be effectively adapted to the case where it is possible to pass only one circuit pattern between the neighboring lands and the land arrangement is not smaller than 6×6. In a normal semiconductor chip, furthermore, the lands are arranged according to the normal lattice arrangement or the normal staggered lattice arrangement while maintaining an equal distance in the vertical and lateral directions. However, the idea of the present invention can be adapted even to a semiconductor chip having pitches of arrangements that are slightly different in the vertical and lateral directions.

BRIEF DESCRIPTION OF THE DRAWINGS

These and other objects of the present invention will become apparent from the following detailed description of the preferred embodiment of the invention, taken in connection with the accompanying drawings.

In the drawings.

DESCRIPTION OF THE PREFERRED EMBODIMENTS

Figure 1:
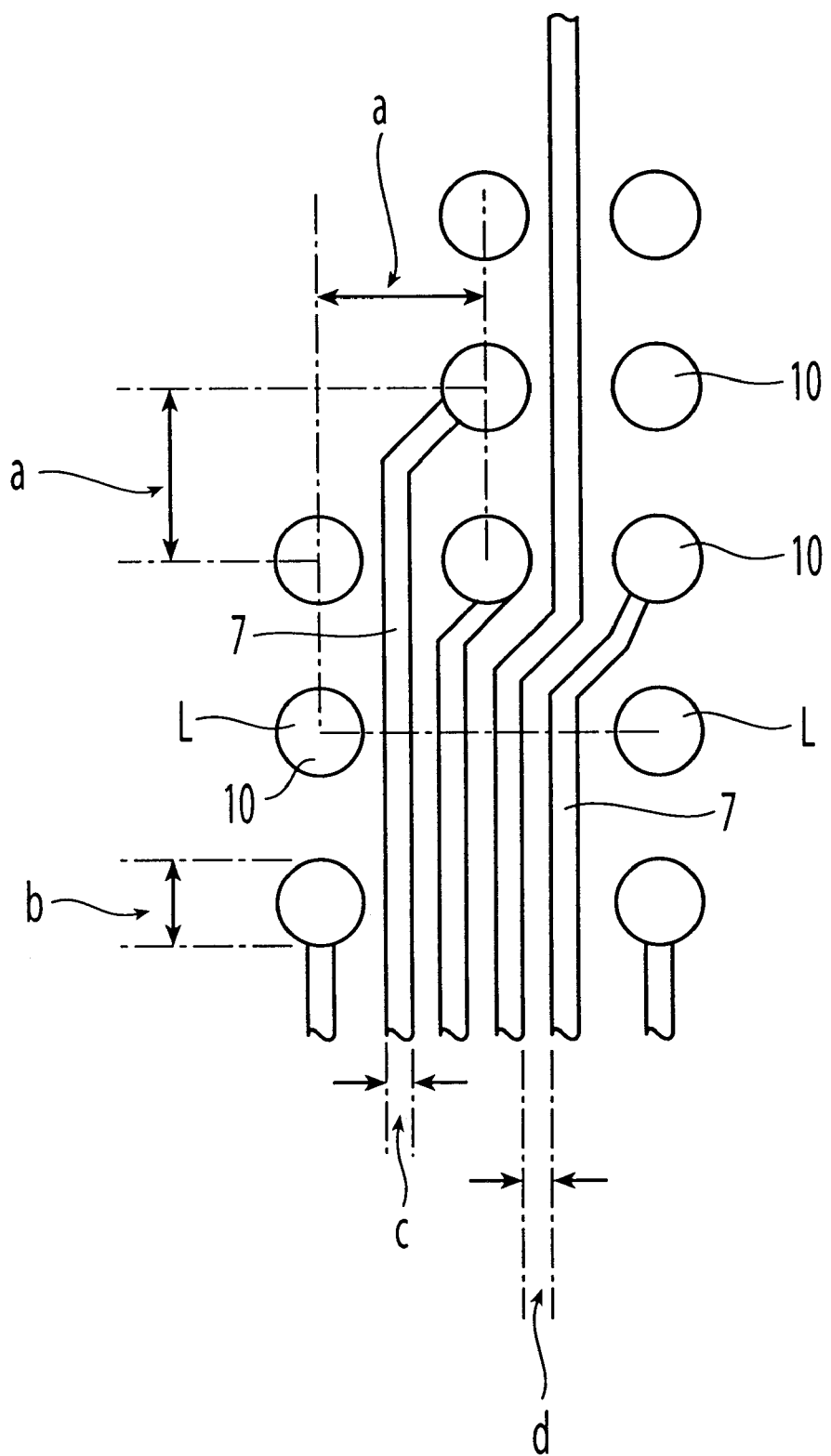
FIG. 1 is a view illustrating circuit patterns arranged between the lands in an enlarged scale.
Figure 2:
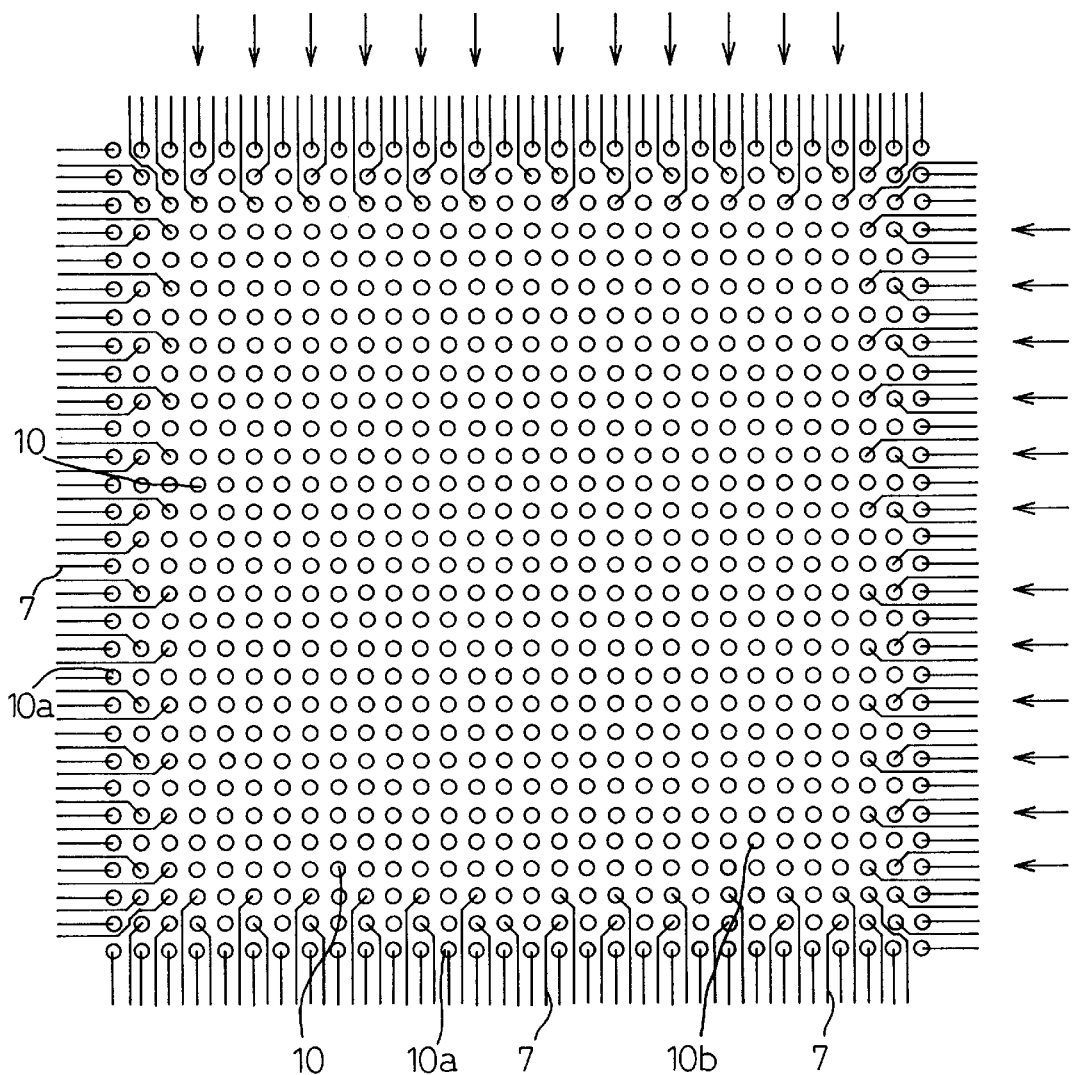
FIG. 2 is a view illustrating circuit patterns on the first layer according to a first embodiment.

In this specification, the phrase "normal lattice form" means that a plurality of lands are arranged in such a manner that adjacent lands are equidistantly arranged both in the direction of columns and in the direction of rows wherein the rows and columns are perpendicular to each other. FIGS. 2–11 and 12–19 depict a normal lattice form.

In this specification, the phrase "staggered lattice form" means that a plurality of lands are arranged in such a manner that adjacent lands are equidistantly arranged both in the direction of columns and the direction of rows wherein the rows and columns are oriented at an angle of 45° or 135° with respect to each other. FIGS. 20–23 depict a staggered lattice form.

In the description of the embodiment provided below the symbols α, m, n, and k are defined as follows:

α: the number of circuit patterns that can be passed through the space between the neighboring lands m: the number of circuit patterns that can be passed through the space between the lands at both ends.

n: the number of lands equidistantly arranged on a single row.

k: $\alpha(n-1)+(n-2)$.

Embodiment 1

Described below is a multi-layer circuit board for mounting an electronic part having lands arranged in the form of a normal lattice of 30×30 pins, the circuit patterns being arranged under the following conditions.

Land pitch: 250 $\mu$m

Land diameter: 130 $\mu$m

Pattern width: 40 $\mu$m

Space between patterns: 40 $\mu$m

The conditions of this embodiment are adapted to the above-mentioned method of determination, as follows:

When n=3, k=(n31 1)+(n−2)=2n−3=3 m=(land pitch)×(n−1)−(land diameter)−(space between patterns)}÷(pattern width+space between patterns)

={250×2−130−40}/(40+40)
=4.125>4(=k+1)

When N is 3 in this embodiment, therefore, the circuit patterns are so arranged as to preferentially draw a circuit pattern from an intermediate land among the three lands, in order to accomplish an efficient arrangement.

FIGS. 2 to 6 illustrate an example for forming circuit patterns on each of the first to fifth layers in the case of the above-mentioned land arrangement. The first layer is the one to which the semiconductor chip is joined, and the second to fifth layers are successively laminated on the first layer. The drawings illustrate the arrangement of all terminals of 30×30 pins. In the first layer shown in FIG. 2, the lands 10 joined to every land are provided in the same arrangement as that of the lands of the electronic part.

In the case of this embodiment, it is effective if the circuit patterns 7 are so drawn as to erase every other sequences of lands 10. Therefore, all circuit patterns 7 are drawn from the lands of the outermost circumference, and land sequences are so set as to preferentially draw every other sequences of circuit patterns 7 on each side.

In this embodiment, only one circuit pattern 7 is allowed to pass between the neighboring lands 10. Therefore, a maximum number of lands from which the circuit patterns 7 can be drawn is three for each sequence. Reference numeral 10a denotes a land from which the circuit pattern 7 is drawn, and 10b denotes a land from which no circuit pattern 7 is drawn. Land sequences from which the circuit patterns 7 can be preferentially drawn are indicated by arrows.

The lands to which no circuit pattern 7 is connected on the first layer are electrically connected to the second layer through vias.

Figure 3:
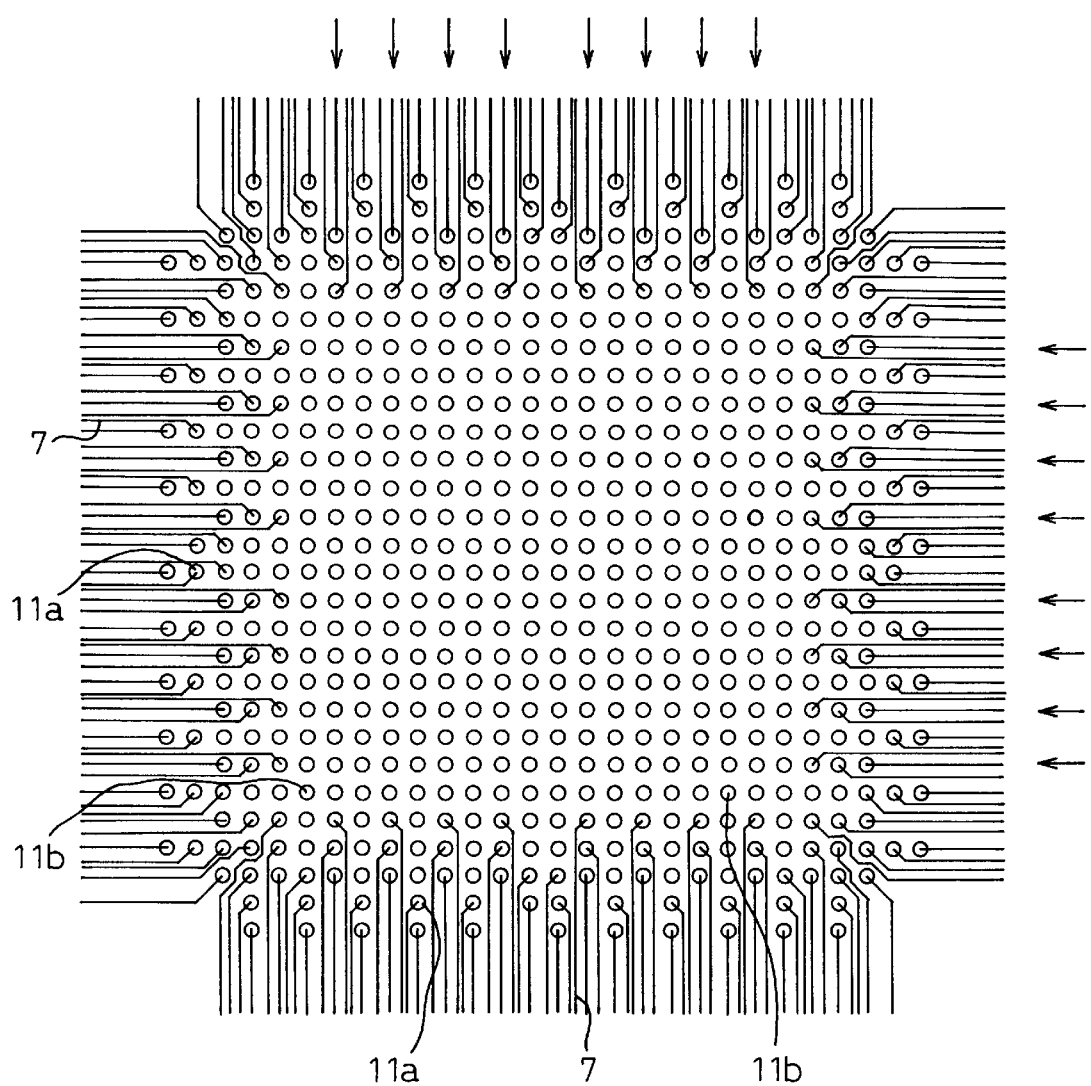
FIG. 3 is a view illustrating circuit patterns on the second layer according to the first embodiment.

FIG. 3 illustrates how to draw the circuit patterns 7 on the second layer. The circuit patterns 7 on the second layer are drawn in the same manner as on the first layer. The circuit patterns 7 are drawn from the lands 10 of the inner side of the land sequence at the same position as the land sequence from which the circuit patterns 7 are preferentially drawn on the first layer. The region for arranging the lands 10 from where the circuit patterns 7 are drawn on the first layer can be utilized as space for drawing the circuit patterns, making it possible to draw circuit patterns 7 from the lands 10 of more inner side on the second layer.

Reference numeral 11a denotes a land from where the circuit pattern 7 is drawn on the second layer, and 11b denotes a land from where no circuit pattern 7 is drawn. The lands 11a and 11b are electrically connected to the lands 10b on the first layer through vias. The lands 11b are electrically connected to the lands of the third layer by means of vias.

Figure 4:
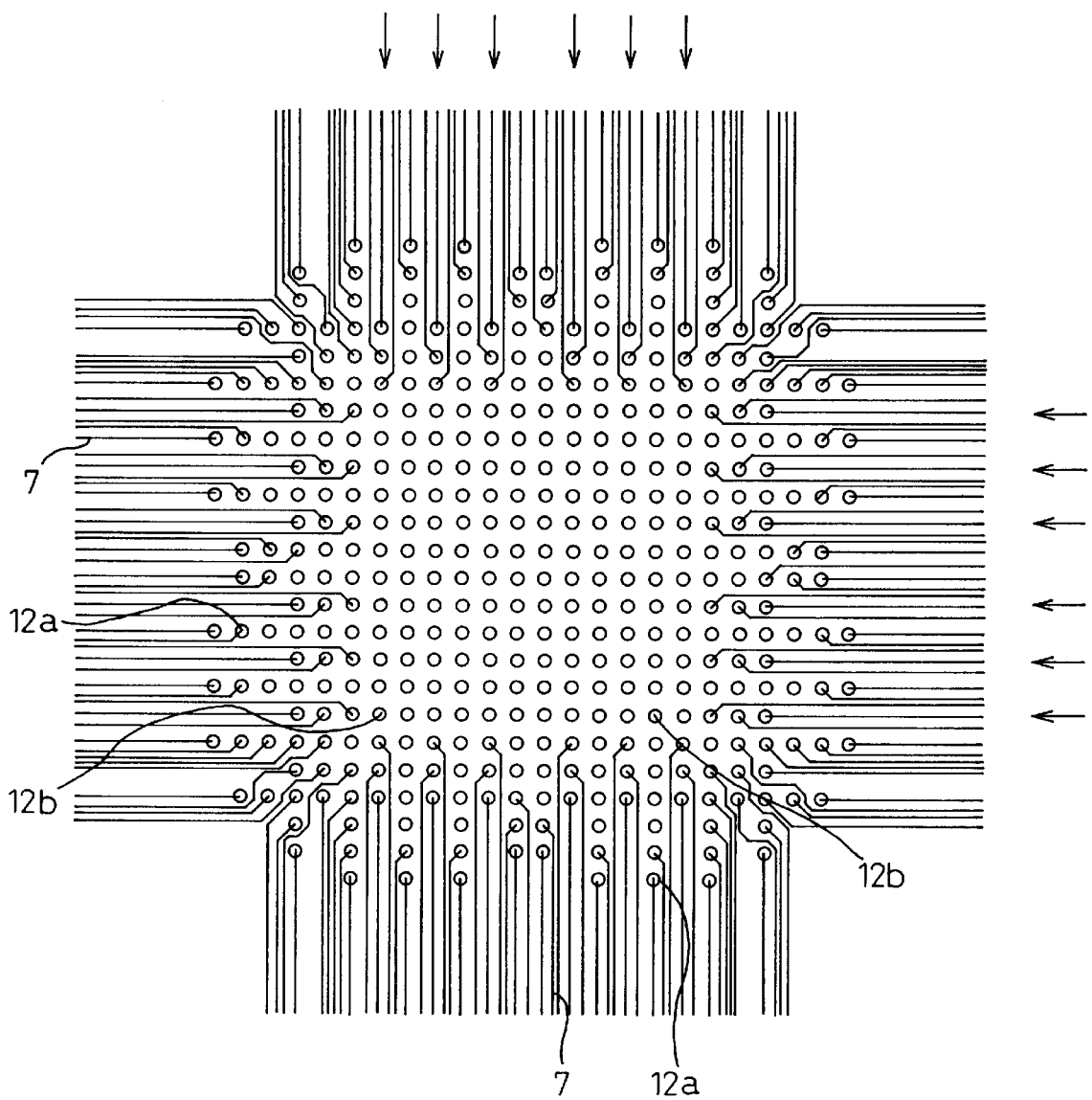
FIG. 4 is a view illustrating circuit patterns on the third layer according to the first embodiment.

FIG. 4 illustrates how to draw the circuit patterns 7 on the third layer. The circuit patterns 7 on the third layer are drawn in the same manner as on the first layer and on the second layer. The circuit patterns 7 are drawn from the inner side of the sequences from where the circuit patterns are preferentially drawn. In this case, too, the circuit patterns 7 are drawn from the three lands on the same sequence. Reference numeral 12a denotes a land from where the circuit pattern 7 is drawn on the third layer, and 12b denotes a land from where no circuit pattern 7 is drawn. The lands 12a and 12b are electrically connected to the lands 10 on the first layer and on the second layer. The lands 12b are electrically connected to the lands of the fourth layer by means of vias.

Figure 5:
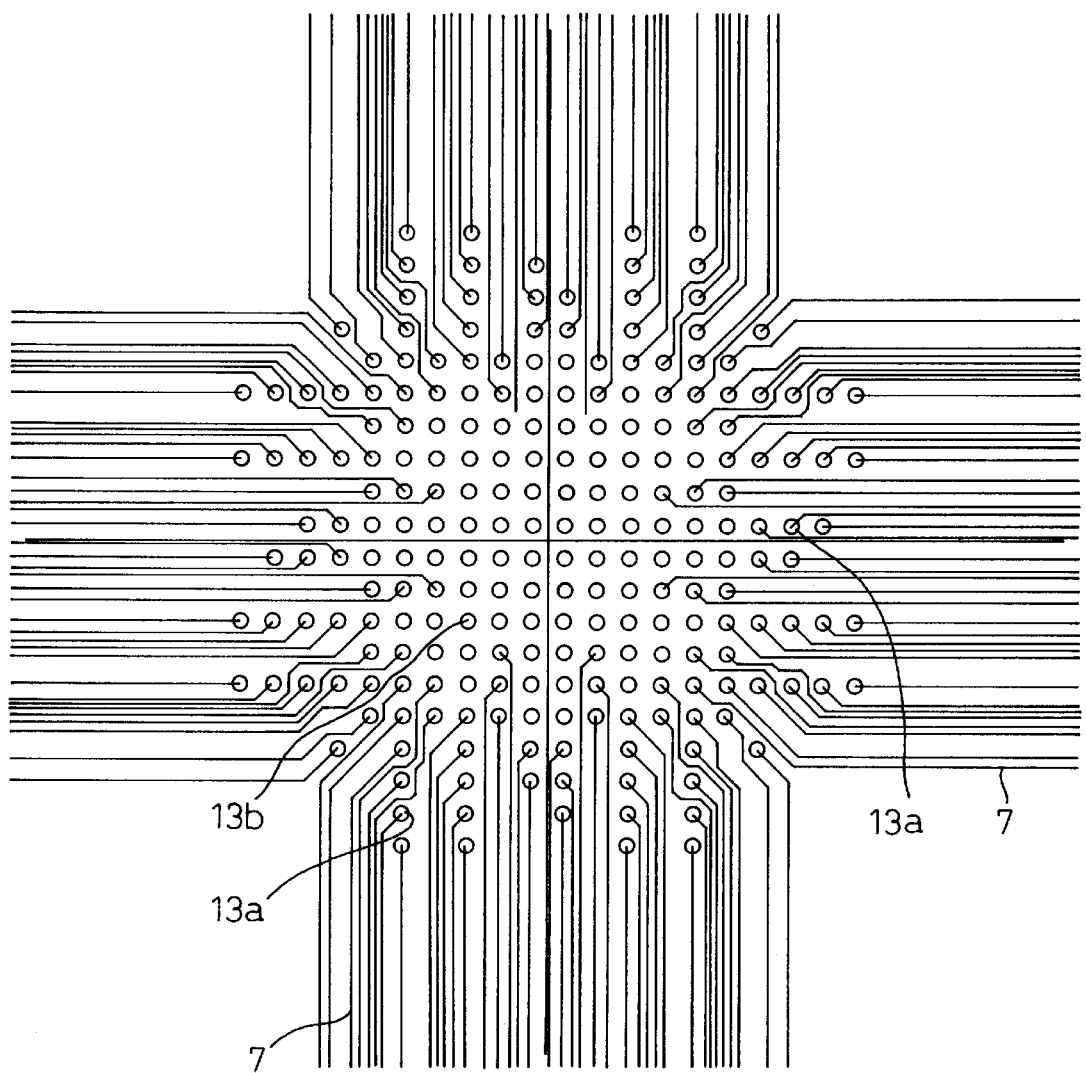
FIG. 5 is a view illustrating circuit patterns on the fourth layer according to the first embodiment.
Figure 6:
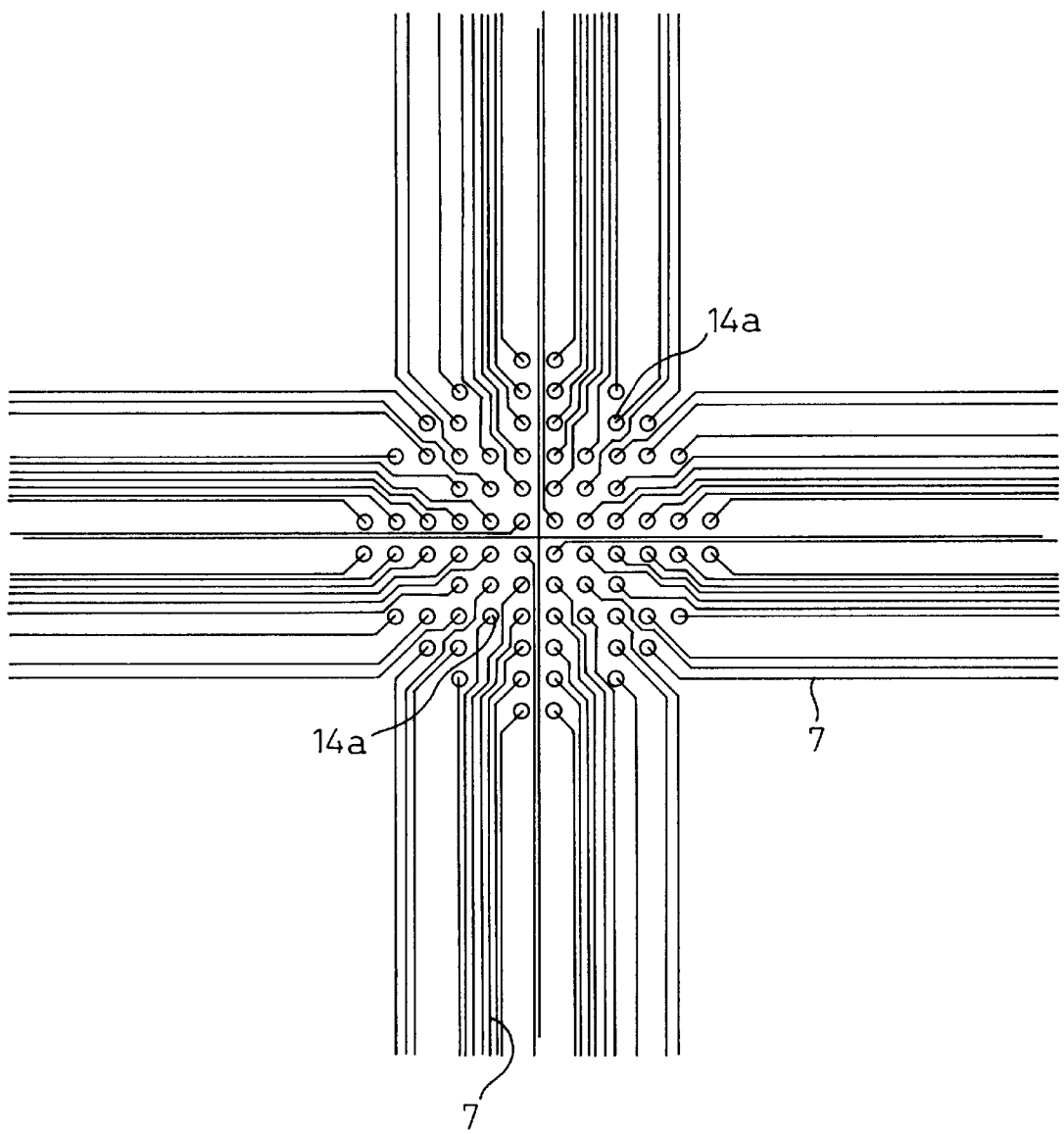
FIG. 6 is a view illustrating circuit patterns on the fifth layer according to the first embodiment.

FIG. 5 illustrates how to draw the circuit patterns 7 on the fourth layer, and FIG. 6 illustrates how to draw the circuit patterns 7 on the fifth layer. The circuit patterns 7 on the fourth layer and on the fifth layer are drawn in the same manner as on the first to third layers. In FIG. 5, reference numeral 13a denotes a land from where the circuit pattern 7 is drawn, and 13b denotes a land from where no circuit pattern 7 is drawn. The lands 13a and 13b are electrically connected to the lands 10 on the first, second and third layers. In FIG. 6, reference numeral 14a denote a land from where the circuit pattern 7 is drawn. On the fifth layer, the circuit patterns 7 are drawn from every land.

Figure 24:
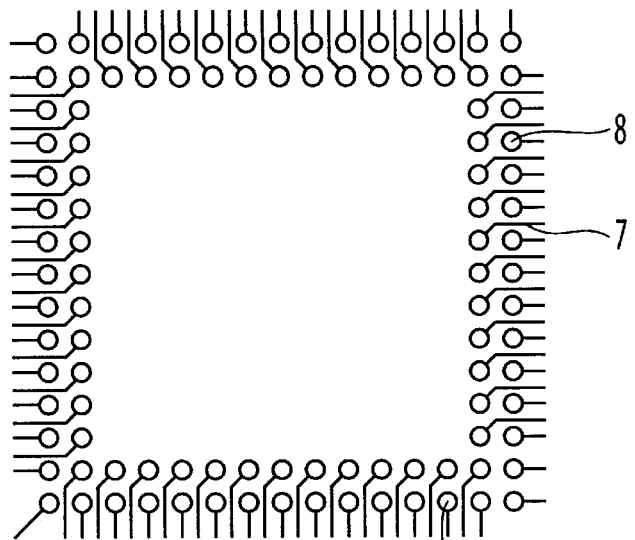
FIG. 24 is a view illustrating a conventional arrangement of circuit patterns in a normal lattice form.
Figure 25:
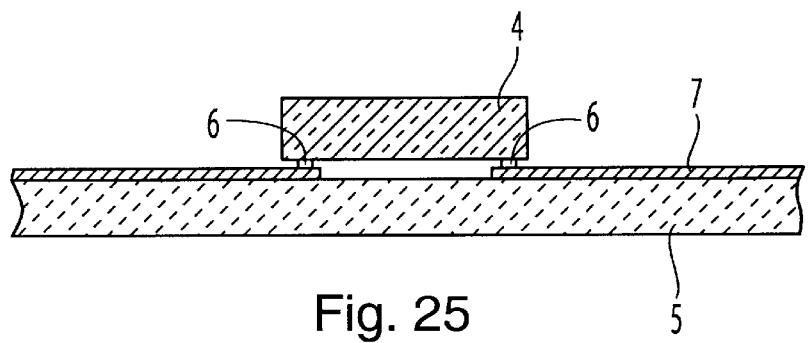
FIG. 25 is a view showing a state where a semiconductor chip is mounted based on a flip-chip connection.
Figure 26:
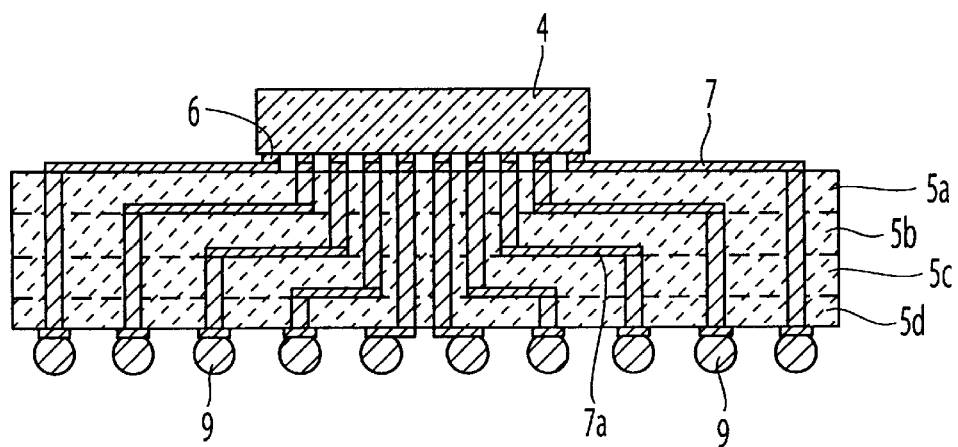
FIG. 26 is a sectional view showing a state where a semiconductor chip is mounted on a multi-layer circuit board.

In this embodiment as described above, the circuit patterns are drawn from every land by using circuit boards in five layers. Seven layers will be required when the circuit patterns are drawn from the two lands of the outer side on each of the layers according to the method shown in FIG. 24.

Embodiment 2

Described below is a multi-layer circuit board for mounting an electronic part having lands arranged in the form of a normal lattice of 30×30 pins, the circuit patterns 7 being arranged under the following conditions.

Land pitch: 240 μm
Land diameter: 110 μm
Pattern width: 43 μm
Space between patterns: 43 μm The conditions of this embodiment are adapted to the above-mentioned method of determination, as follows:

When n=3,
k=(n−1)+(n−2)=2n−3=3
m=(land pitch)×(n−1)−(land diameter)−(space between patterns)}+(pattern width+space between patterns)
={(40×2−110−43}/(43+43 )
=3.8<4(=k+1)

When n=4,
k=(n−1)+(n−2)=2n−3=−5
m=(land pitch)×(n−1)−(land diameter)−(space between patterns)}+(pattern width+space between patterns)
={240×3−110−43}/(43+43)
≈6.6>6(=k+1)

From the above results, when n=3, it does not hold that m≦(k+1). Therefore, the effect for drawing the circuit patterns is not improved even though the circuit patterns are drawn from every other land sequence as in embodiment 1. When n=4, on the other hand, m>(k+1) holds. This means that the efficiency of arrangement can be improved if the circuit patterns are so arranged to draw the circuit patterns from the intermediate two lands among the four lands.

FIGS. 7 to 11 illustrate an example in which the circuit patterns 7 are arranged being drawn from the lands 10 according to the above-mentioned arrangement standard. FIGS. 7 to 11 illustrate one-fourth of the 30×30 pin arrangement.

Figure 7:
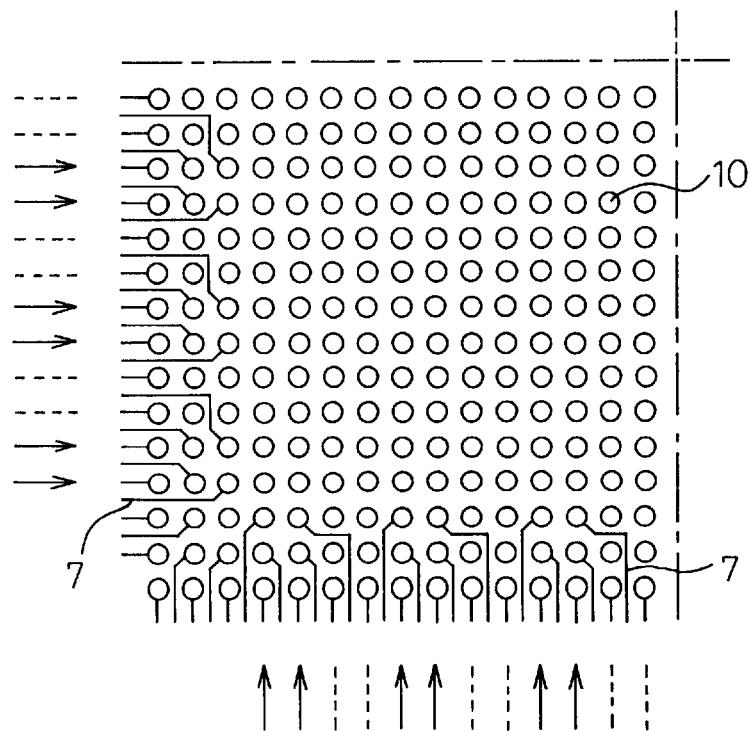
FIG. 7 is a view illustrating circuit patterns on the first layer according to the second embodiment.

FIG. 7 illustrates the arrangements of circuit patterns 7 on the first layer. In this embodiment, the circuit patterns 7 are preferentially drawn from the intermediate two lands 10 among the four lands 10. In the drawings, arrows indicate the positions of land sequences from where the circuit patterns are preferentially drawn. Two arrows are arranged after every other two sequences. In this embodiment, the land sequences from where the circuit patterns 7 are preferentially drawn are arranged after every other two sequences. On the land sequences from where the circuit patterns 7 are preferentially drawn, the circuit patterns 7 are drawn from the three lands as in the above-mentioned embodiment.

Figure 8:
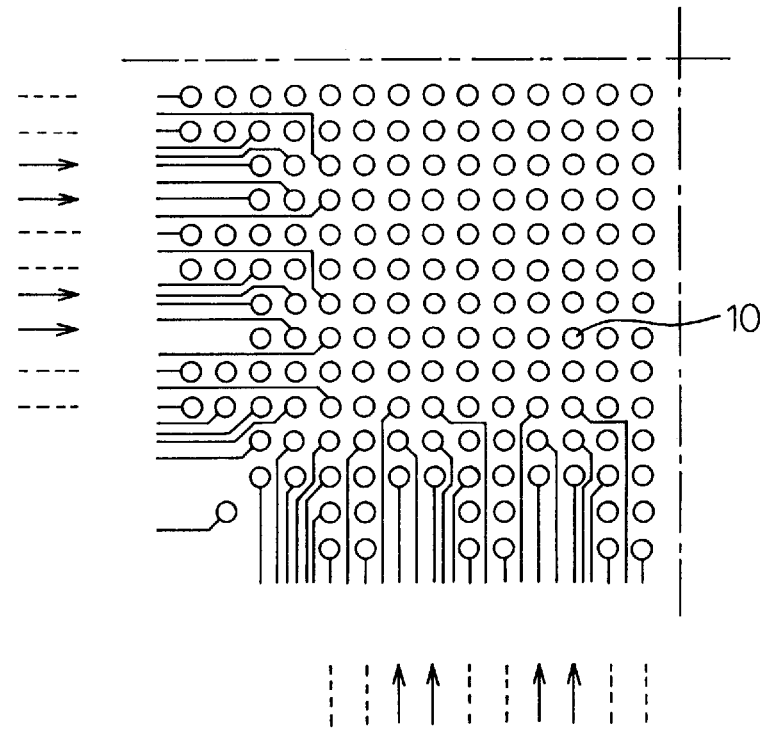
FIG. 8 is a view illustrating circuit patterns on the second layer according to the second embodiment.

FIG. 8 illustrates the arrangement of circuit patterns 7 on the second layer. Even on the second layer, the circuit patterns 7 are preferentially drawn from the predetermined land sequences- (arrows) for preferentially drawing the circuit patterns 7, and six circuit patterns 7 can be drawn on the region where the circuit patterns have already been drawn on the first layer. Therefore, the circuit patterns 7 are arranged under these conditions.

Figure 9:
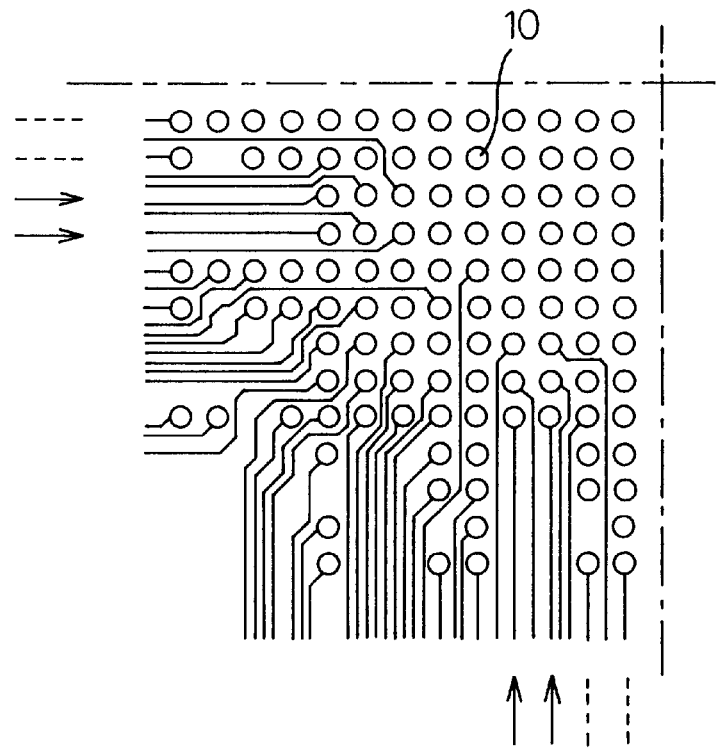
FIG. 9 is a view illustrating circuit patterns on the third layer according to the second embodiment.
Figure 10:
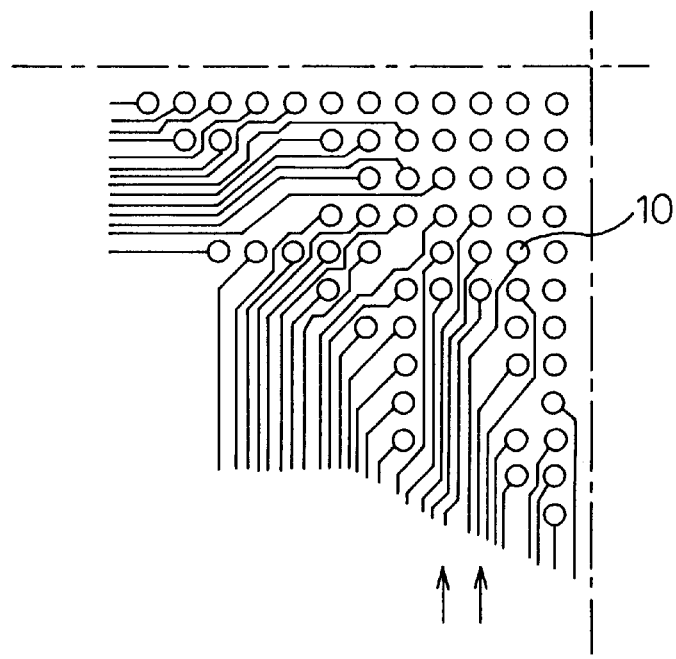
FIG. 10 is a view illustrating circuit patterns the fourth layer according to the second embodiment.
Figure 11:
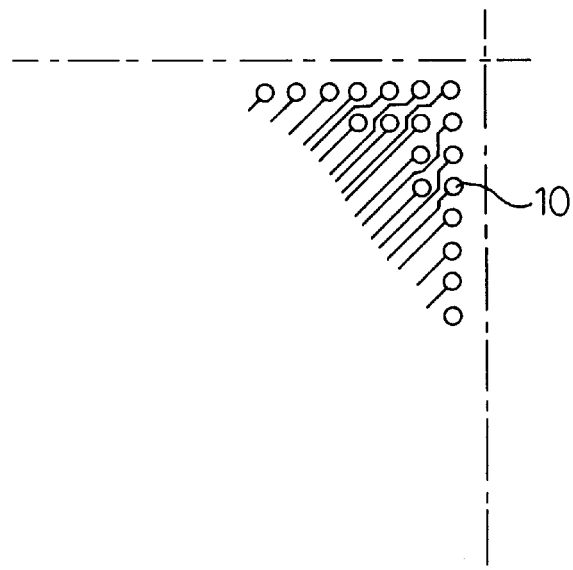
FIG. 11 is a view illustrating circuit patterns on layer according to the second embodiment.

FIG. 9 illustrates the arrangement of circuit patterns on the third layer, FIG. 10 illustrates the arrangement of circuit patterns on the fourth layer, and FIG. 11 illustrates the arrangement of circuit patterns on the fifth layer. Even in these cases, the circuit patterns 7 are drawn from the land sequences at predetermined positions for preferentially drawing the circuit patterns. The circuit patterns 7 are successively drawn from the lands 10 positioned on the outer side. Therefore, a land 10 near the corner is drawn first among the lands 10 arranged in the normal lattice form. Therefore, the circuit pattern 7 may be drawn in any direction irrespective of the above-mentioned conditions from the land 10 arranged near the corner.

In this embodiment, too, five circuit board layers are used to draw the circuit patterns from every land 10.

Embodiment 3

Described below is a multi-layer circuit board for mounting an electronic part having lands arranged in the form of a normal lattice of 42×42 pins, the circuit patterns 7 being arranged under the following conditions.

Land pitch: 240 µm
Land diameter: 110 µm
Pattern width: 43 µm
Space between patterns: 43 µm The conditions such as land pitch, land diameter, etc, are quite the same as those of the embodiment 2, and the land sequences for preferentially drawing the circuit patterns 7 are selected in the same manner as in the embodiment 2. That is, the circuit patterns 7 are arranged under the conditions for drawing circuit patterns 7 from the intermediate two lands among the four consecutively arranged lands excluding the lands at both ends.

However, this embodiment has a condition in that when the circuit patterns 7 are preferentially drawn from the two neighboring land sequences, another land sequence (from where no circuit pattern is preferentially drawn) is arranged between the neighboring land sequences. In the embodiment 2, two land sequences were arranged between the land sequences from where the circuit patterns 7 were preferentially drawn.

Figure 12:
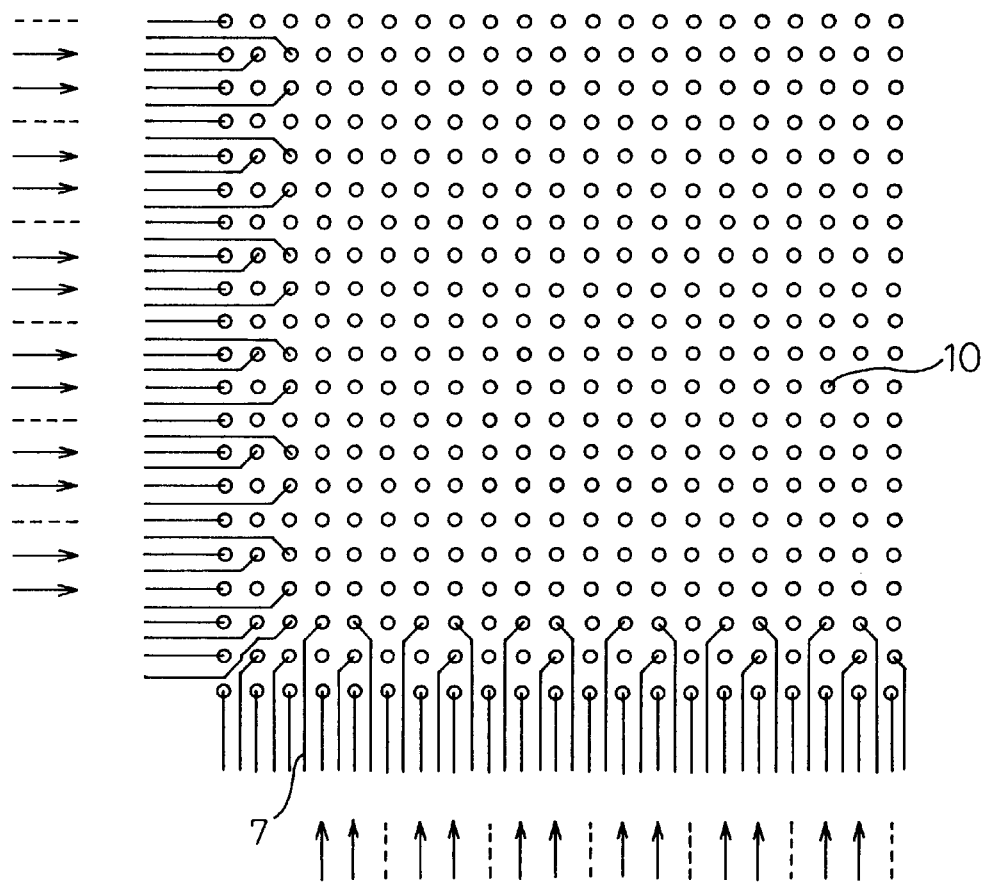
FIG. 12 is a view illustrating circuit patterns on layer according to a third embodiment.
Figure 13:
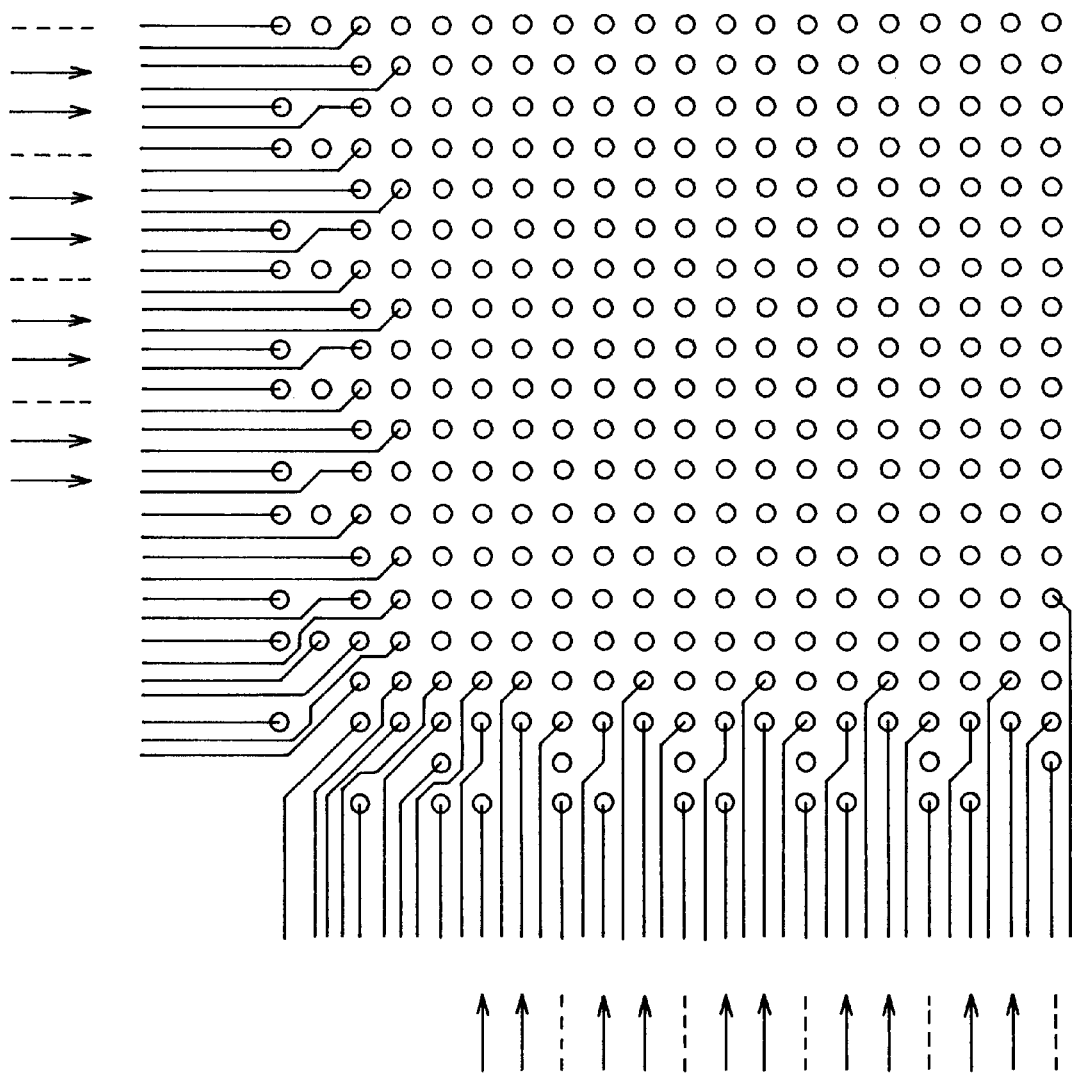
FIG. 13 is a view illustrating circuit patterns on layer according to the third embodiment.
Figure 14:
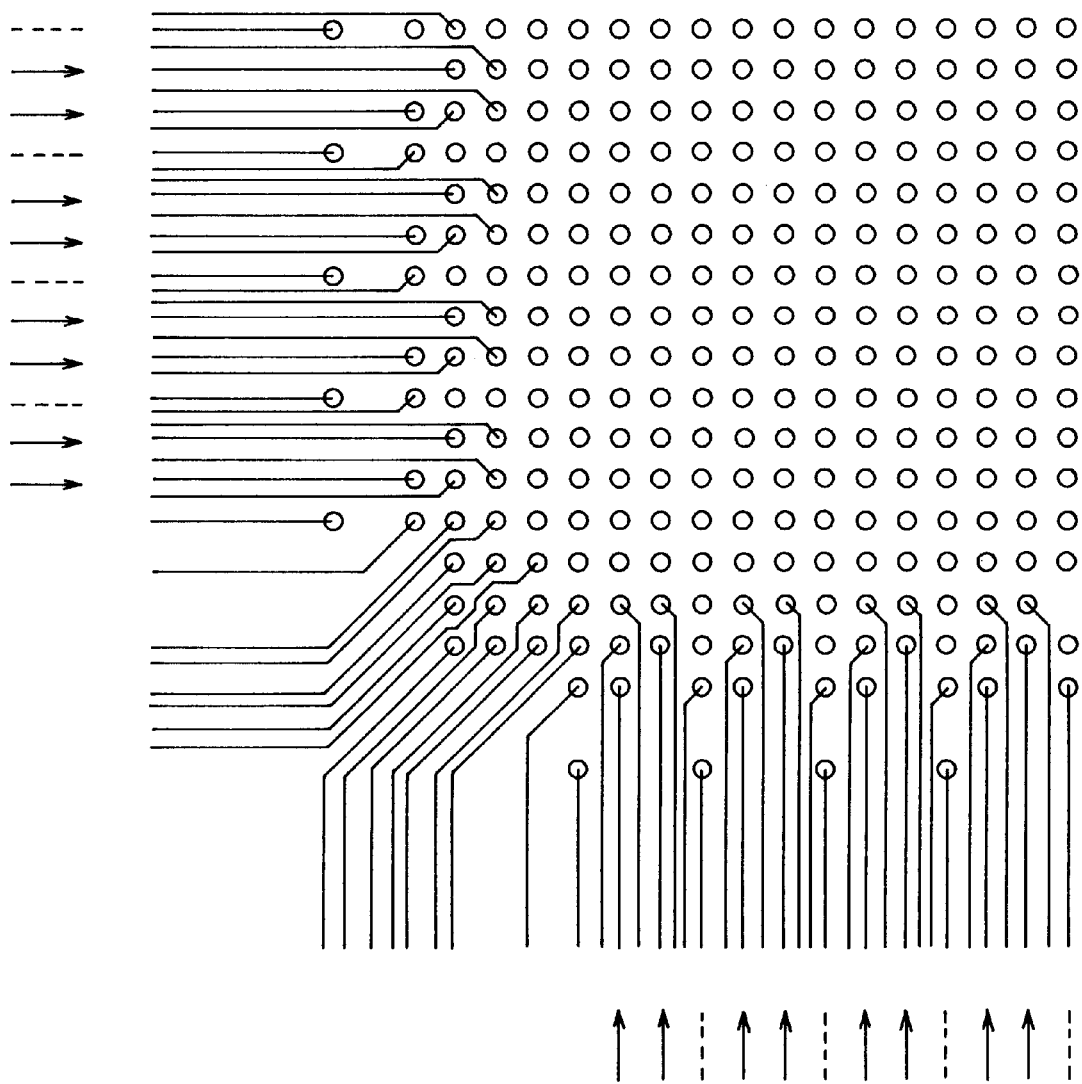
FIG. 14 is a view illustrating circuit patterns on layer according to the third embodiment.
Figure 15:
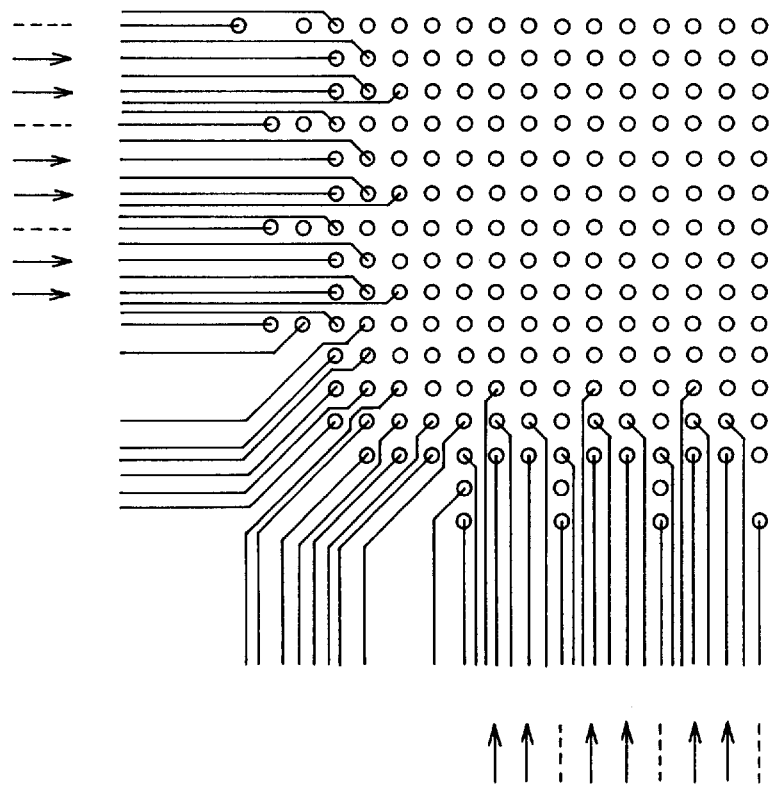
FIG. 15 is a view illustrating circuit patterns on layer according to the third embodiment.
Figure 16:
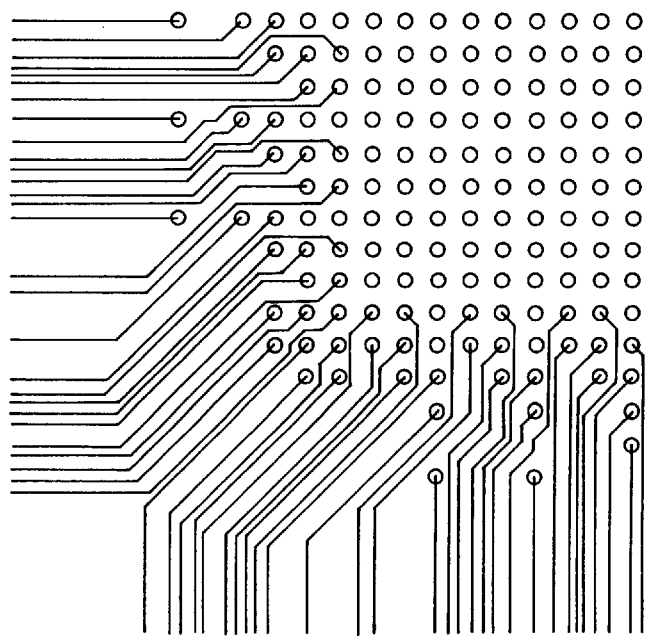
FIG. 16 is a view illustrating circuit patterns on layer according to the third embodiment.
Figure 17:
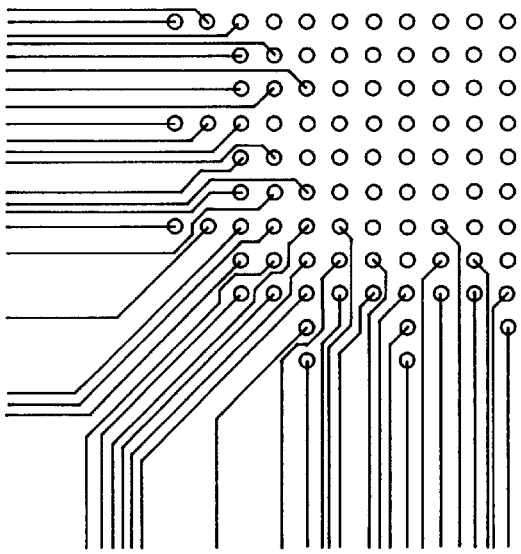
FIG. 17 is a view illustrating circuit patterns on layer according to the third embodiment.
Figure 18:
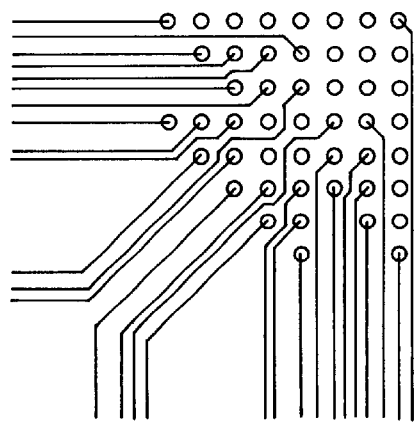
FIG. 18 is a view illustrating circuit patterns on the seventh layer according to the third embodiment.
Figure 19:
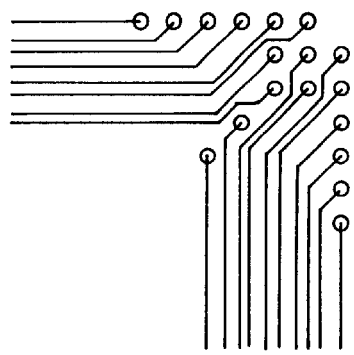
FIG. 19 is a view illustrating circuit patterns the eighth layer according to the third embodiment.

FIG. 12 illustrates the arrangement of circuit patterns 7 on the circuit board of the first layer, and illustrates one-fourth of the whole land pattern. Arrows indicate land sequences from where the circuit patterns 7 are preferentially drawn. As described above, a land sequence from where no circuit pattern 7 is preferentially drawn is arranged between two arrows and two arrows.

From the standpoint of designing the circuit patterns 7, the circuit patterns 7 are drawn from the three lands 10 of one land sequence for preferentially drawing the circuit patterns 7, and the circuit patterns 7 are drawn from only the two lands 10 of the other land sequence.

FIGS. 13 to 19 illustrate the arrangements of circuit patterns 7 on the circuit boards of the second to eighth layers. The land sequences for preferentially drawing the circuit patterns 7 are commonly set on each of the layers in order to preferentially draw the circuit patterns 7 in the same manner as that of the above- mentioned embodiments.

The circuit patterns 7 are successively drawn starting from the first layer, and the lands 10 remaining on the circuit board are erased from the outer side but remain near the central portions. Thus, the lands 10 are gradually erased, and common lands for obtaining common potentials such as ground potential and power-source potential are formed in vacant space in the circuit board.

In this embodiment, the circuit patterns 7 are drawn from every land 10 on eight layers to cope with the normal lattice arrangement of 42×42 pin lands. Ten layers are required when this is done under the same conditions according to the prior art. Thus, the embodiment of the present invention makes it impossible to arrange the circuit patterns 7 on a multi-layer circuit board with a decreased number of layers.

Embodiment 4

Described below is the arrangement of circuit patterns 7 on a multi-layer circuit board for mounting an electronic part having lands arranged in a staggered lattice form, the total number of lands being 450 pins arranged under the following conditions.

Figure 23:
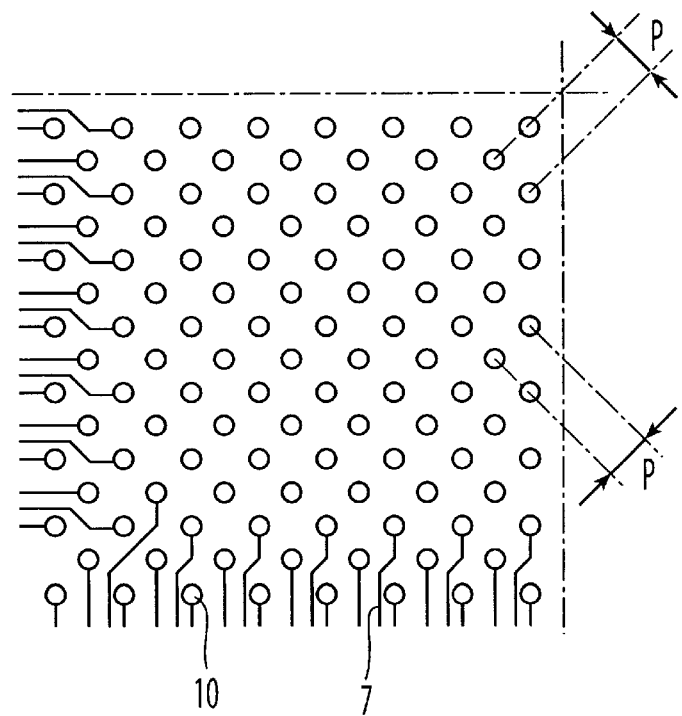
FIG. 23 is a view illustrating a conventional arrangement of circuit patterns in a staggered lattice 30 form.

Distance between neighboring lands: 250 µm
Land diameter: 130 µm
Pattern width: 40 µm
Space between patterns: 40 µm The distance between neighboring lands is a distance P between the closest lands (in a direction in parallel with a diagonal line) as shown in FIG. 23. In the case of the above-mentioned conditions, the circuit pattern space is 223 µm between the lands of the of the outermost sequence, and two circuit patterns can be passed between these lands. On the other hand, circuit pattern space is 120 µm between the closest lands arranged in the direction of 45 degrees. Therefore, only one circuit pattern is allowed to be passed between the closest lands.

Even when the circuit patterns are drawn from the lands in the staggered lattice arrangement under the above-mentioned conditions, the same idea as that of the normal lattice arrangement can be applied. In the case of the staggered lattice arrangement,10 however, the circuit patterns are arranged by regarding the direction of a diagonal line tilted by 45 degrees relative to the direction of land arrangement of the outermost sequence to be the direction of land sequence for drawing the circuit patterns, so that the staggered lattice arrangement can be handled in the same manner as the normal lattice arrangement.

Thus, upon regarding the staggered lattice arrangement to be the same as the normal lattice arrangement, the conditions set in this embodiment are quite the same as the conditions set in the embodiment 1. When n=3, therefore, an efficient arrangement is accomplished by drawing the circuit patterns 7 according to a preferential circuit pattern.

Figure 20:
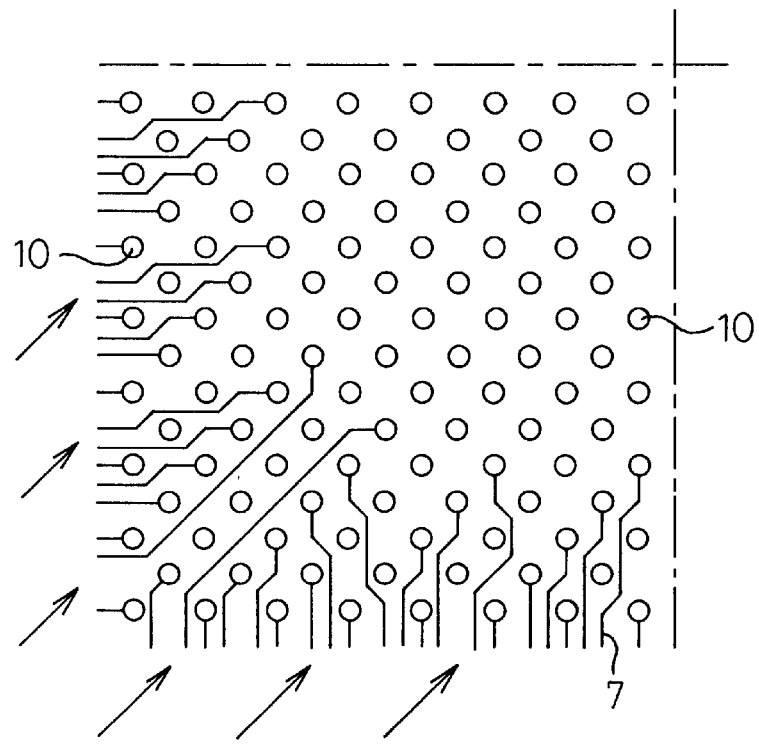
FIG. 20 is a view illustrating circuit patterns the first layer according to a fourth embodiment.
Figure 21:
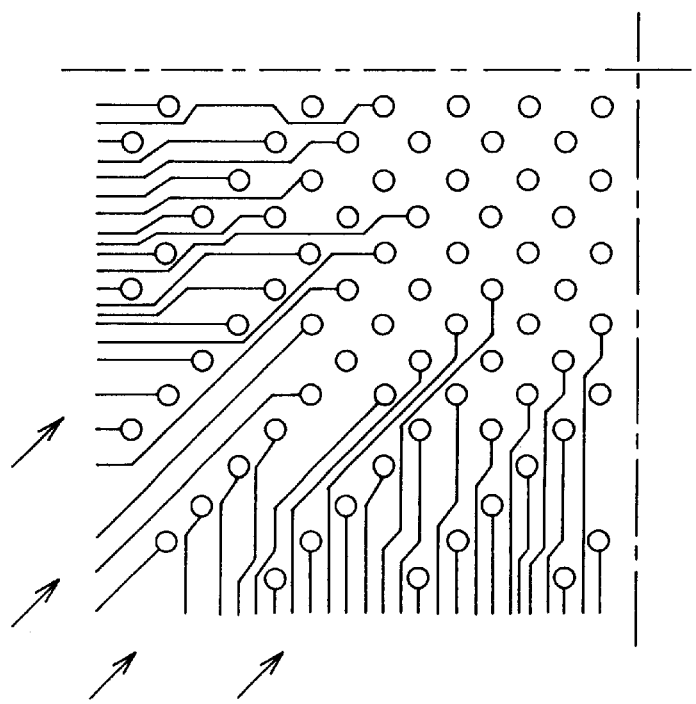
FIG. 21 a view illustrating circuit patterns the second layer according to the fourth embodiment.
Figure 22:
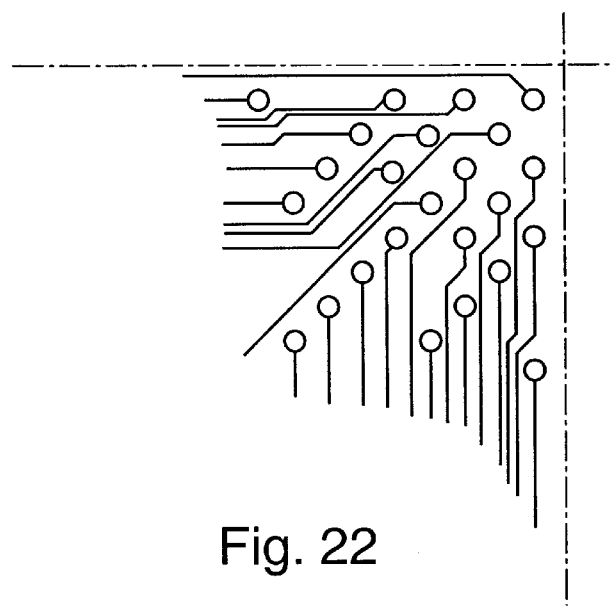
FIG. 22 is a view illustrating circuit patterns the third layer according to the fourth embodiment.

FIGS. 20 to 22 illustrate the arrangement of circuit patterns 7, according to the above-mentioned method, on each of the first to third layers. In FIG. 20, the land sequences in the direction of arrows are those from where the circuit patterns 7 are preferentially drawn. When viewed from the direction of a diagonal line, the lands 10 of every other sequences are erased.

FIGS. 20 to 22 illustrate the arrangement of circuit patterns 7 according to the method of preferentially drawing the circuit patterns from the same land sequence, and the circuit patterns 7 are drawn from every land 10 on three layers. Four or five layers will be required when the circuit patterns 7 are drawn starting from the outermost sequence successively into the inner side in the staggered lattice arrangement under the same conditions as shown in FIG. 23. According to the arrangement of this embodiment, on the other hand, it is possible to obtain a multi-layer circuit board while effectively decreasing the number of the circuit boards.

In the foregoing was described the arrangements of circuit patterns on a multi-layer circuit board mounting an electronic part having lands arranged like an array by way of embodiments. Next, described below are limitations on preparing a multi-layer circuit board in connection with the method of drawing the circuit patterns.

The multi-layer circuit board has vias formed among the layers to electrically connect the circuit patterns among the layers. The vias formed among the layers may be formed vertically but the lands on an upper layer and the lands on a lower layer may often be formed slightly deviated in position on a plane. When vias are vertically formed in the multi-layer circuit board, no limitation is imposed on the above-mentioned method. When the lands on an upper layer and the lands on a lower layer are deviated in position on a plane, however, a limitation is often imposed on the arrangement of circuit patterns.

That is, when the amount of deviation in position between the lands of the upper layer and the lands of the lower layer is denoted by D, no limitation is imposed on the method of the present invention when, D<(distance between lands)−{(pattern width)+(space between patterns)×2).

Limitation is partly imposed on the embodiments 2 and 3 when, (Distance between lands)−{(pattern width)+(space between patterns)×2}<D <(distance between lands)

Limitation is partly imposed on the embodiment 1, or the method becomes quite impossible to carry out when, (Distance between lands)<D <(distance between lands)×√2

As described above, the multi-layer circuit board of the present invention is for mounting an electronic part having lands arranged in a normal lattice form or in a staggered form, and is constituted by using circuit boards (wiring layers) in a number as small as possible, making it possible to improve the yield of production maintaining high reliability. Moreover, the multi-layer circuit board of the present invention permits an increased number of circuit patterns (lands) to be drawn on each circuit board compared with the prior art enabling vacant space to be formed on the circuit board and excellent electric properties to be provided by effectively utilizing the vacant space.

It is to be understood that the invention is by no means limited to the specific embodiments illustrated and described herein, and that various modifications thereto may be made which come within the scope of the present invention as defined in the appended claims.

What is claimed is:

1. A multi-layer circuit board comprising:

an upper circuit layer and a plurality of subsequent circuit layers successively laminated below the upper most circuit layer to form a stack, each circuit layer comprising a substrate having a surface and edges, a plurality of land regions arranged equidistantly in columns and rows in a normal lattice form, and circuit patterns formed on the surface of the substrate;

wherein the plurality of land regions on the upper circuit layer are each occupied by a land and the arrangement of lands corresponds to the arrangement of electrodes on a semiconductor element that is to be mounted on the upper circuit layer and is characterized by a pitch of the lands, a diameter of the lands, a width of patterns, a space between patterns, a parameter α that represents the number of patterns that can pass through adjacent lands, and a parameter n that represents the smallest integer that satisfies the equation m≧(k+1) wherein m={(land pitch)×(n−1)−(land diameter)−(space between patterns)}÷(pattern width+space between patterns)

and k=α(n−1)+(n−2)

wherein, on the upper circuit layer, all of the lands in the outermost row/column of lands are connected to circuit patterns that are drawn toward the edges of the substrate, and some of the lands on inner row/columns, on selected rows/columns, are preferentially connected to circuit patterns that are drawn toward the edges of the substrate;

wherein the plurality of lands on the subsequent circuit layers are arranged to correspond to the arrangement of lands from which circuit patterns are not drawn on the adjacent circuit layer that is higher in the stack;

and wherein, on a subsequent circuit layer, all of the lands located in the outermost position of the lands are connected to circuit patterns that are drawn toward the edges of the substrate, some of the lands on selected inner position of lands, which are on the same columns/rows as the upper most circuit layer, are preferentially connected to circuit patterns that are drawn toward the edges of the substrate;

wherein said selected columns/rows are determined as the particular columns/rows selected as the remaining (n−2) columns/rows subtracted from both ends of consecutively arranged (n) land sequences;

wherein lands from which no circuit patterns are drawn on a subsequent circuit layer are electrically connected through vias to the lands formed on the adjacent circuit layer that is lower in the stack; and wherein regions of a subsequent circuit layer that correspond to regions of the lands from which circuit patterns are drawn on the adjacent circuit pattern that is higher in the stack are utilized as regions for drawing circuit patterns.

2. A multi-layer circuit board according to claim 1, wherein a plurality of groups of land sequences are regularly disposed, each group having (n) land sequences as a recurring unit, and wherein (n−2) land sequences are selected from each of these groups, as the draw out sequences from which the circuit patterns are drawn.

3. A multi-layer circuit board according to claim 1, wherein a plurality of groups of land sequences are regularly disposed, each group having (n−1) land sequences as a recurring unit, and wherein (n−2) land sequences are selected from each of these groups, as the draw out sequences from which the circuit patterns are drawn.

4. A multi-layer circuit board comprising:

an upper circuit layer and a plurality of subsequent circuit layers successively laminated below the upper most circuit layer to form a stack, each circuit layer comprising a substrate having a surface and edges, a plurality of land regions arranged equidistantly in columns and rows in a normal lattice form, and circuit patterns formed on the surface of the substrate;

wherein the plurality of land regions on the upper circuit layer are each occupied by a land and the arrangement of lands corresponds to the arrangement of electrodes on a semiconductor element that is to be mounted on the upper circuit layer and is characterized by a pitch of the lands; a diameter of the lands, a width of patterns, a space between patterns, a parameter α that represents the number of patterns that can pass through adjacent lands, and a parameter n that represents the smallest integer that satisfies the equation m≧(k+1) wherein $$m=\{(\text{land pitch}) \times (n-1) - (\text{land diameter}) - (\text{space between patterns})\} \div (\text{pattern width} + \text{space between patterns})$$

and $$k = \alpha(n-1) + (n-2)$$

wherein, on the upper circuit layer, all of the lands on the rows and columns closest to the edge of the substrate are connected to circuit patterns that are drawn toward the edges of the substrate and some of the lands on the rows and columns other than those on the edge of the substrate are connected to circuit patterns that are drawn toward the edges of the substrate;

wherein the plurality of lands on the subsequent circuit layers are arranged to correspond to the arrangement of lands from which circuit patterns are not drawn on the adjacent circuit layer that is higher in the stack, and wherein all the lands on the subsequent circuit layers that are closest to the edge of the substrate are connected to circuit patterns that are drawn to the edge of the substrate; and wherein the lands on the rows other than those on the edges of the substrate are grouped into a plurality of n adjacent lands and 2 lands on each end of the group are not connected to circuit patterns and circuit patterns are drawn toward the edges of the substrate from the remaining (n−2) lands of the group of lands on the rows other than those on the edge of that substrate;

wherein lands from which no circuit patterns are drawn on a subsequent circuit layer are electrically connected through vias to the lands formed on the adjacent circuit layer that is lower in the stack; and wherein regions of a subsequent circuit layer that correspond to regions of the lands from which circuit patterns are drawn on the adjacent circuit pattern that is higher in the stack are utilized as regions for drawing circuit patterns.

5. A multi-layer circuit board according to claim 4, wherein a plurality of groups of land sequences are regularly disposed, each group having (n) land sequences as a recurring unit, and wherein (n−2) land sequences are selected from each of these groups, as the draw out sequences from which the circuit patterns are drawn.

6. A multi-layer circuit board according to claim 4, wherein a plurality of groups of land sequences are regularly disposed, each group having (n−1) land sequences as a recurring unit, and wherein (n−2) land sequences are selected from each of these groups, as the draw out sequences from which the circuit patterns are drawn.

* * * * *